(12) United States Patent
Kugel et al.

(10) Patent No.: US 10,318,470 B1
(45) Date of Patent: Jun. 11, 2019

(54) SYSTEMS AND METHODS FOR DATA TRANSFER OVER A SHARED INTERFACE

(71) Applicant: Altera Corporation, San Jose, CA (US)

(72) Inventors: Alexander Kugel, High Wycombe (GB); Dekel Shirizly, ParkFinchley Barnet (GB)

(73) Assignee: Altera Corporation, San Jose, CA (US)

( * ) Notice: Subject to any disclaimer, the term of this patent is extended or adjusted under 35 U.S.C. 154(b) by 59 days.

(21) Appl. No.: 15/282,020

(22) Filed: Sep. 30, 2016

(51) Int. Cl.
  *H04L 29/06* (2006.01)
  *G06F 13/42* (2006.01)
  *H03M 7/30* (2006.01)
  *H03M 7/42* (2006.01)

(52) U.S. Cl.
  CPC .......... *G06F 13/4282* (2013.01); *H04L 69/04* (2013.01); *H04L 69/22* (2013.01); *G06F 2213/0026* (2013.01); *H03M 7/30* (2013.01); *H03M 7/42* (2013.01); *H03M 7/6064* (2013.01)

(58) Field of Classification Search
  CPC .... H03M 7/30; H03M 7/3082; H03M 7/6011; H03M 7/6052; H03M 7/6064; H03M 7/42; G06F 2212/401; H04L 69/22; H04L 69/04; H04W 28/06
  See application file for complete search history.

(56) References Cited

U.S. PATENT DOCUMENTS

| 9,450,852 | B1* | 9/2016 | Chen | .................. H04L 43/0817 |
| 2008/0056273 | A1* | 3/2008 | Pelletier | .................. H04L 69/04 370/395.21 |
| 2011/0019552 | A1* | 1/2011 | Karaoguz | ............... H04L 45/00 370/236 |
| 2017/0187388 | A1* | 6/2017 | Satpathy | ............. H03M 7/3082 |

* cited by examiner

*Primary Examiner* — Ernest Unelus
(74) *Attorney, Agent, or Firm* — Fletcher Yoder, P.C.

(57) ABSTRACT

A method for compressing is provided. The method includes compressing, via a processor, a portion of a first data packet to generate a second data packet having a compressed portion. The method includes transmitting the second data packet having the compressed portion via an interface to a co-processor. The processor and the co-processor are communicatively coupled via the interface. The method also includes unpacking, via the co-processor, the compressed portion of the second data packet to restore the first data packet.

13 Claims, 6 Drawing Sheets

SYSTEMS AND METHODS FOR DATA TRANSFER OVER A SHARED INTERFACE

BACKGROUND

The present disclosure relates generally to integrated circuits. More specifically, the present disclosure relates to improving an efficiency of data transfer over an interface.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Certain network architectures involve a processor that accesses the functionality of a co-processor via a shared interface. For example, in certain situations, a processor may run one or more virtual machines (VMs), and the processor running the virtual machines may interface with a co-processor, such as acceleration circuitry. As a further example, in certain situations, the processor may run in a hypervisor mode or may run one or more containers, and may interface with a co-processor for added functionality. Further still, in certain embodiments, the processor may be a single operating system (e.g., desktop computer) that accesses the functionality of a co-processor via a shared interface. However, in certain situations, the shared interface may have limited bandwidth, and may not be equipped to cope with the traffic. However, increasing the bandwidth of the shared interface may involve replacing physical components within the system.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to systems and methods for improving an efficiency of data transfer across a shared interface between a processor and a co-processor. In certain embodiments, the processor may run a plurality of software (SW) and may access a co-processor via the shared interface. In particular, embodiments of the present disclosure relate to improving the efficiency of data transfer across the shared network by compressing data, via each of the plurality of SW running on the processor, prior to transmitting it across the shared interface to the co-processor. For example, in certain embodiments of the present disclosure, the SWs may compress a portion of the data packet (e.g., header, data payload, or both) prior to transmitting the compressed data packet across the shared interface to the co-processor.

BRIEF DESCRIPTION OF THE DRAWINGS

Advantages of the disclosure may become apparent upon reading the following detailed description and upon reference to the drawings in which.

DETAILED DESCRIPTION OF SPECIFIC EMBODIMENTS

One or more specific embodiments of the present disclosure will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in further detail below, embodiments of the present disclosure generally relate to efficiently transferring data between a processor and a co-processor across a shared interface. Specifically, the processor may run a plurality of software (SW) that accesses the functionality of the co-processor via the shared interface. Likewise, in certain situations, the co-processor may access the functionality of the processor via the shared interface. As an example, in certain embodiments, the processor may run a plurality of virtual machines (VMs), and the co-processor may include a hardware (HW) accelerator. In certain embodiments, the processor may run in a hypervisor mode, and may access the co-processor via the shared interface. Further, in certain embodiments, the processor may run a plurality of containers, and may access the co-processor via the shared interface. Further, in certain embodiments, the processor may operate as a single operating system and may access a co-processor, such as a separate operating system, via a shared interface. Indeed, the disclosed embodiments may relate to these and other situations where a processor accesses the functionality of a co-processor via a shared interface.

In certain embodiments, the processor may run a plurality of SW, which may access the functionality of a co-processor via the shared interface. Specifically, as noted above, the shared interface between the each of the one or more SW and the co-processor may include a limited bandwidth. Accordingly, while each individual SW may not generate enough traffic to congest the shared interface, multiple SW running the processor may accumulate to generate a significant amount of traffic that the interface may not be equipped to handle. Indeed, in certain situations, the interface may create a bottleneck that may prevent the co-processor from being fully utilized by the processor. However, increasing the bandwidth of the interface may involve replacing existing circuitry or physical components, which may be costly. Accordingly, it may be beneficial to provide for systems and methods for efficiently transferring data across the shared interface, such as between the one or more processors and co-processors.

Accordingly, embodiments of the present disclosure relate to improving an efficiency of data transfer across a shared interface, between one or more processors and one or more co-processors. In particular, embodiments of the present disclosure relate to improving the efficiency of data transfer across the shared network by compressing data prior to transmitting it across the shared interface. For example, in certain embodiments of the present disclosure, each SW running on the processor may compress a portion of the data packet (e.g., header) prior to transmitting the compressed data packet across the shared interface to the co-processor. As a further example, in certain embodiments of the present disclosure, the SW may compress the entire data packet prior to transmitting the compressed data packet across the shared interface to the co-processor. Once the co-processor receives the compressed data packet, the co-processor may unpack the compressed data prior to utilizing it in the intended manner.

It should be noted that in certain embodiments, the data may flow from the co-processor to each of the SWs, and the co-processor may compress the data packet (e.g., a portion of the data packet or the whole data packet), prior to transmitting the data packet across the shared interface to the SWs. In this manner, embodiments of the present disclosure may efficiently transfer data across the limited bandwidth of the shared interface, without increasing the bandwidth of the shared interface or adding additional circuitry.

Figure 1:
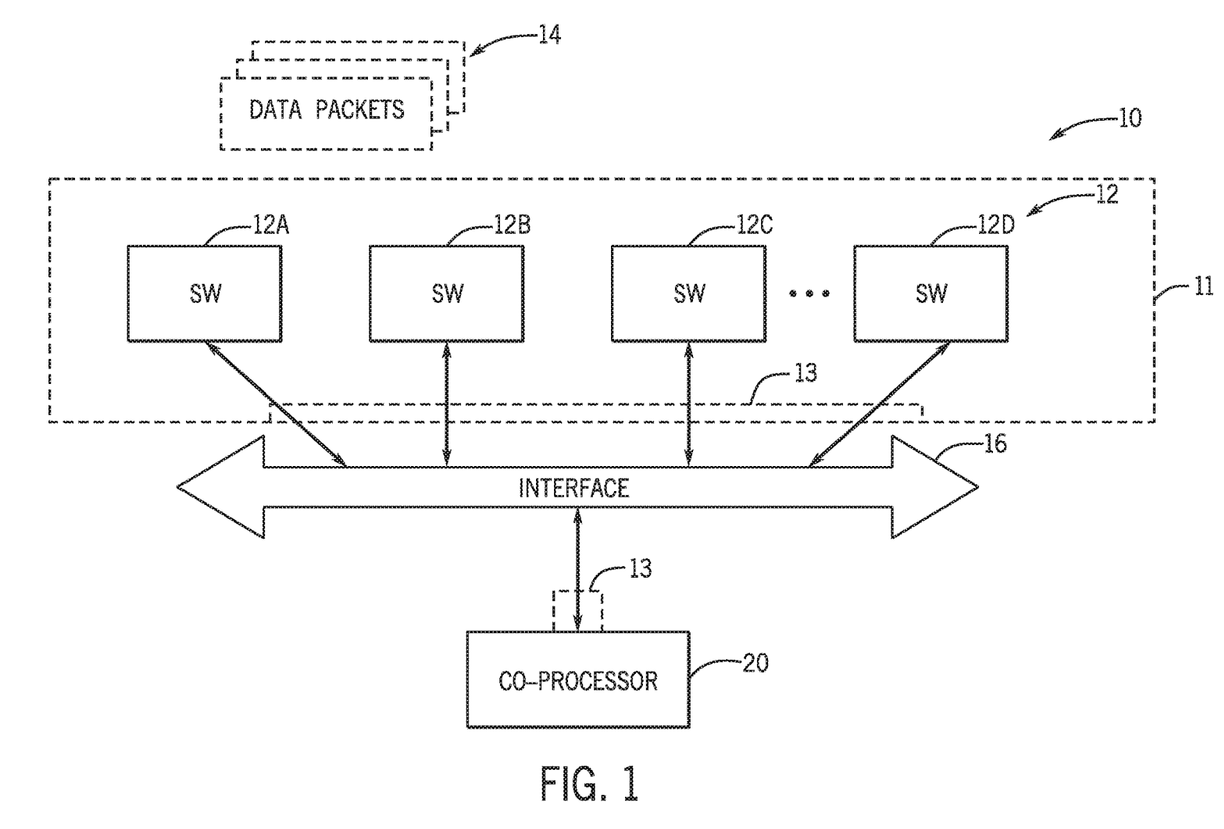
FIG. 1 is a block diagram of an embodiment of a system that includes a processor running a plurality of software (SWs), a co-processor, and a shared interface, in accordance with aspects of the present disclosure.

With the forgoing in mind, FIG. 1 is a block diagram of an embodiment of a system 10 that includes a processor 11 running a plurality of software (SWs) 12, a co-processor 20, and a shared interface 16 between the processor 11 and the co-processor 20, in accordance with aspects of the present disclosure. In certain embodiments, the processor 11 may run a plurality of virtual machines (VMs), a plurality of containers, or may operator as a single operating system. In certain embodiments, the processor 11 may run in a hypervisor mode. In particular, in certain embodiments, each of the one or more SW 12 may push data across the shared interface 16 to the co-processor 20. However, the bandwidth of the combined or accumulated information that the SWs 12 attempt to transmit over the shared interface 16 may exceed the bandwidth capacity of the shared interface 16. Indeed, while the co-processor 20 may support and receive the combined or accumulated information transmitted by the SWs 12, the shared interface 16 may have bandwidth constraints that create an information bottleneck and that reduce efficiency.

Accordingly, the disclosed embodiments are related to utilizing data compression techniques to minimize the amount of data transmitted by each SW 12 across the shared interface 16, thereby minimizing the total amount of accumulated traffic transmitted over the shared interface 16. Further, once the co-processor 20 receives the compressed data via the shared interface 16, the co-processor 20 may unpack the compressed data. It should be noted that in certain embodiments, the co-processor 20 may compress the data prior to transmitting it across the shared interface 16 to the one or more SWs 12.

In certain embodiments, a processor 11 (e.g., processor circuitry or multiple processor circuits operating together) may run a plurality of SWs 12. For example, each SW 12 (e.g., a first SW 12A, a second SW 12B, a third SW 12C, and a fourth SW 12D) of the processor 11 may emulate a computer system, and may access the functionality of and/or transmit information to the co-processor 20 via the shared interface 16. Indeed, the components of the system 10 may allow for a physical device to appear as multiple devices for use in multiple virtual machines. In certain embodiments, data transmitted via the shared interface 16 may be transmitted through process I/O logic 13 within the processor 11 and through corresponding processor I/O logic 13 within the co-processor 20 (e.g., accelerator circuitry, co-processor, etc.). In certain embodiments, the shared interface 16 may be a Peripheral Component Interconnect Express (PCIe) interface that may be used to send and receive data between the SWs 12 and the co-processor 20. In certain embodiments, the shared interface 16 may be a Peripheral Component Interconnect (PCI), an advanced microcontroller bus architecture (AMBA), any type of shared system bus, or any other type of network interface that may allow for data communications between the SWs 12 and the co-processor 20.

In certain embodiments, each SW 12 may receive and/or generate a plurality of data packets 14. Each data packet 14 may include information associated with video, audio, text, images, or any type of information that may be desired, as further described with respect to FIG. 2. In particular, each SW 12 may compress the data packet 14 before transmitting the compressed data packet across the shared interface 16. For example, in certain embodiments, each SW 12 may compress a portion of the data packet 14, such as a header of the data packet 14, before transmitting the compressed data packet 14 across the shared interface 16 to the co-processor 20, as further described with respect to FIGS. 3 and 4. As a further example, in certain embodiments, each SW 12 may compress the entire data packet 14 and/or a data payload of the data packet 14, before transmitting the compressed data packet 14 across the shared interface 16 to the co-processor 12, as further described with respect to FIGS. 5 and 6. It should be noted that in certain embodiments, the co-processor 20 may compress the data packet 14 (e.g., entire data packet 14 or a portion of the data packet 14) before transmitting the data packet 14 across the shared interface 16 to the one or more SWs 12.

Figure 2:
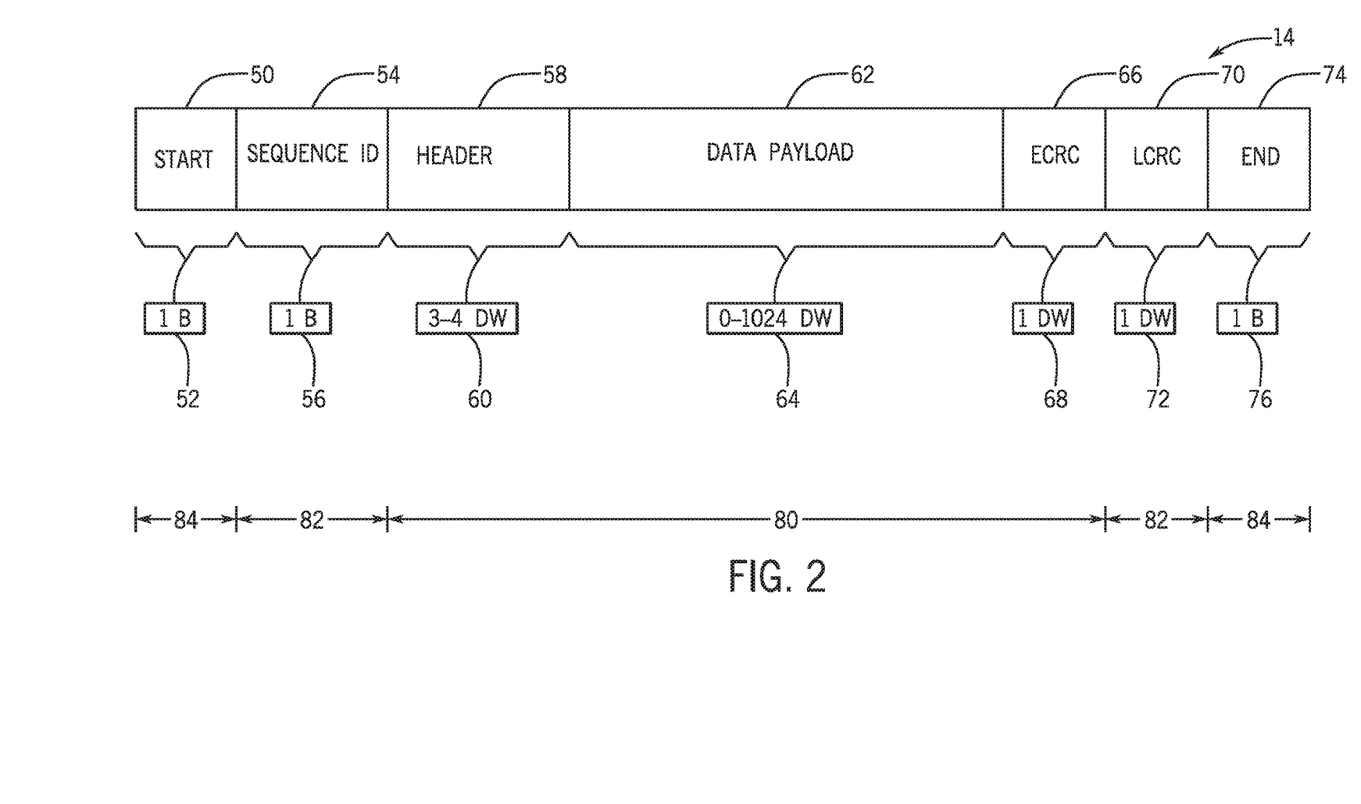
FIG. 2 is a block diagram of an embodiment of a data packet utilized within the system of FIG. 1 to transmit information across the shared interface, in accordance with aspects of the present disclosure.

FIG. 2 is a block diagram of an embodiment of the data packet 14 utilized within the system 10 of FIG. 1. In particular, the format of the data packet 14 may include a start framing symbol 50 (having a length 52 of approximately 1 Byte), a sequence ID 54 (having a length 54 of approximately 1 Byte), a header 58 (having a length 60 of approximately 3-4 dwords (DW)), a data payload 64 (having a length 66 of approximately 0-1024 DW), an end-to-end CRC (ECRC) 66 (having a length 68 of approximately 1 DW), a link cyclic redundancy check (LCRC) 70 (having a length 72 of approximately 1 DW), and an end framing symbol 74 (having a length 76 of approximately 1 Byte). In certain situations, one (1) dword is equivalent to 4 Bytes.

In certain embodiments, the user logic interfaces to the transaction layer to create the transaction layer packets 80, which contain the header 58, the data payload 62, and the ECRC 66. In embodiments where the ECRC 66 is generated, the ECRC 66 may be generated by user logic at the transmitter (e.g., the SWs 12) and checked by the user logic at the receiver (e.g., the co-processor 20). The data link layer 82 may be responsible for link management and error detection. Accordingly, the data link layer 82 may append the LCRC 70 and prepend the sequence ID 54 to the transaction layer packets 80. The physical layer 84 may append the start framing symbol 50 and prepend the end framing symbol 74 to the data link layer 82.

In certain embodiments, the SWs 12 may compress one or more of the transaction layer packets 80 to generate a compressed data packet that may be transmitted across the shared interface 16. For example, in certain embodiments, the SWs 12 may compress the header 58, as further described with respect to FIGS. 3 and 4. As a further example, in certain embodiments, the SWs 12 may compress the header 58 and/or the data payload 62, as further described with respect to FIGS. 5 and 6.

Figure 3:
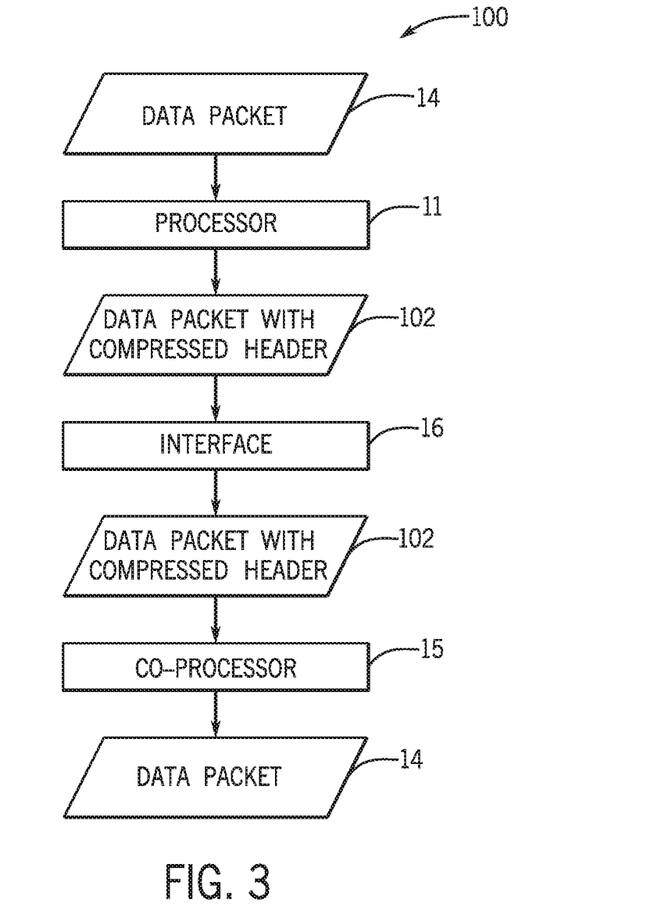
FIG. 3 is a data flow diagram illustrating data flows within the system of FIG. 1, in accordance with aspects of the present disclosure.

FIG. 3 is a data flow diagram 100 illustrating data flows within the system 10, in accordance with aspects of the present disclosure. Specifically, in certain embodiments, the data flow diagram 100 includes a data packet 14 generated by and/or provided to the SW 12. In certain embodiments, the SW 12 may compress the header 58 of the data packet 14, via one or more header compression techniques, as further described below. The SW 12 generates a data packet with compressed header 102. Further, the SW 12 may transmit the data packet 14 with the compressed header 102 to the co-processor 20 via the shared interface 16. It should be noted that in the illustrated embodiment, the data packet with the compressed header 102 includes the original data payload 62. In particular, each of the one or more SWs 12 may compress the header 58 of each data packet 14 prior to transmitting the data packet 14 across the shared interface 16, thereby improving the efficiency of data transfer over the shared interface 16. In certain embodiments, the co-processor 20 receives the data packet with compressed header 102 and unpacks it to generate and/or restore the original data packet 14.

In certain embodiments, the SW 12 may compress the header 58 utilizing one or more different header compression techniques that may be used to compress networking headers of packets for transmission over wireless links. For example, the SW 12 may compress the header 58 by replacing the original header 58 with a compressed header, as further described with respect to FIG. 4. Specifically, in certain embodiments, the SW 12 may remove the Ethernet, IP, UDP/TCP, MPLS, VXLAN, GENEVE, or other header types from the data packet 14, and may replace the original type with a compressed header having a flow ID, as described with respect to FIG. 4. In certain embodiments, the compressed header may additionally or alternatively include a traffic class and/or a payload length. Specifically, compressing the header 58 may reduce the length 60 of the header 58, thereby reducing the bandwidth needed to transmit the data packet 14 across the shared interface 16.

In certain embodiments, once the header 58 is compressed, the SW 12 may transmit the compressed header and the original payload 62 across the shared interface 16 to the co-processor 20. Further, once the co-processor 20 receives the data packet with the compressed header and the original payload 62, the co-processor 20 may unpack the compressed header to restore the original header 58.

Figure 4:
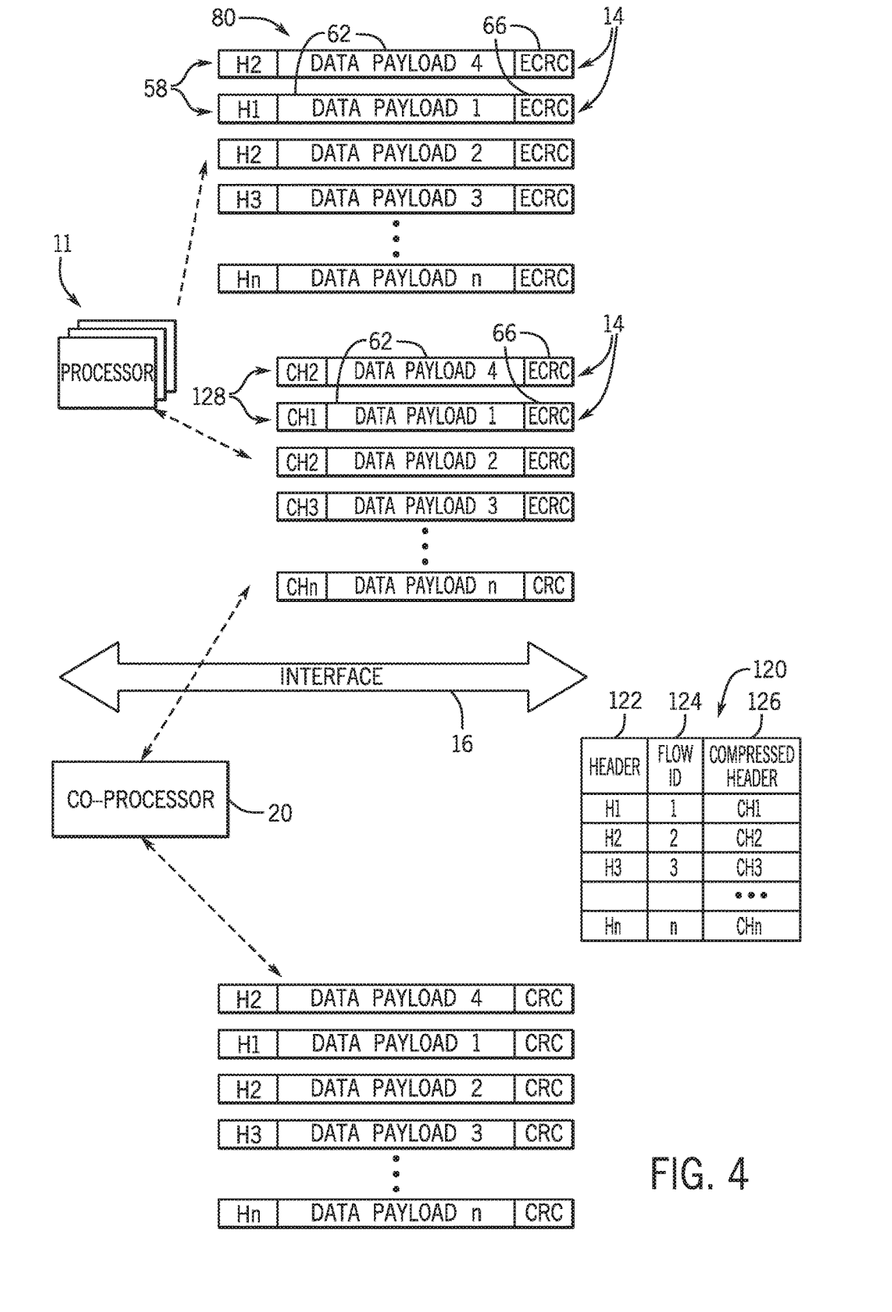
FIG. 4 is a block diagram of an embodiment of the data flows of FIG. 3, in accordance with an embodiment.

FIG. 4 is a block diagram of an embodiment of the data flow between the SW 12 and the co-processor across the shared interface 16. In the illustrated embodiment, the transaction layer packets 80 are illustrated for each data packet 14. As noted above, the transaction layer packets 80 for each data packet 14 may include the header 58, the data payload 62, and the ECRC 66. In particular, the SW 12 may compress the header 58 based on a translation table 120 (e.g., look-up table 120).

Specifically, the translation table 120 may include information that associates a type of header 122 with a corresponding flow ID 124 and a corresponding compressed header type 126. In particular, in certain embodiments, the length 60 of the header 58 may be reduced from 3-4 DW when the header 58 is compressed to generate the compressed header 128. In certain embodiments, each type of header 122 may correspond to the same flow ID 124, and may include fields that vary between consecutive frames of the same flow. For example, the fields may include IPv4 identification, flags and fragment offset, TCP segmentation sequence number, and others. In certain embodiments, the header 58 may store all the fields of the original data packet 14, including various variable fields. Each SW 12 may send these variable fields within the compressed header 128. For example, each compressed header 128 may include a header ID width, a length width, a CoS and color, and/or variable fields. In certain embodiments, the translation table 120 may include additional information that corresponds the header 58 with the compressed header 128, such as traffic class information and/or payload length information.

Accordingly, the SW 12 may utilize the translation table 120 to convert or replace the header 58 of each data packet 14 with a corresponding compressed header 128. In particular, the SW 12 may replace the header 58 (e.g., H1, H2, H3, Hn, etc.) of each data packet 14 with the compressed header 128 (e.g., CH1, CH2, CH3, CH4, CHn, etc.). In the illustrated embodiment, the SW 12 does not compress or otherwise alter the data payload 62 or the ECRC 66 of the data packet 14. However, in certain embodiments, the SW 12 may compress the header 58 and the data payload 62, as further described with respect to FIGS. 5 and 6.

Furthermore, in certain embodiments, the SW 12 may transmit the data packet 14 with the compressed header 128 (and original data payload 62 and ECRC 66) to the co-processor 20 via the shared interface 16. It should be noted that each of the one or more SWs 12 may compress the header 58 of the data packet 14 to generate the compressed header 128, thereby reducing the bandwidth needed to transmit the accumulated data from the multiple SWs 12 across the shared interface 16.

In certain embodiments, the co-processor 20 may unpack the compressed header 128 of the data packet 14 received from the shared interface 16. Specifically, the co-processor 20 may utilize the same translation table 120 (e.g. look-up table) to unpack the compressed header 128 and restore the original header 58. It should be noted that in certain embodiments, the co-processor 20 may compress the header 58 and generate the compressed header 128, such that the SWs 12 receive and unpack the compressed header 128 with the translation table 120. Accordingly, in this manner, the system 10 may improve the efficiency of data transfer over the shared interface 16 without affecting the quality or type of data transmitted.

Figure 5:
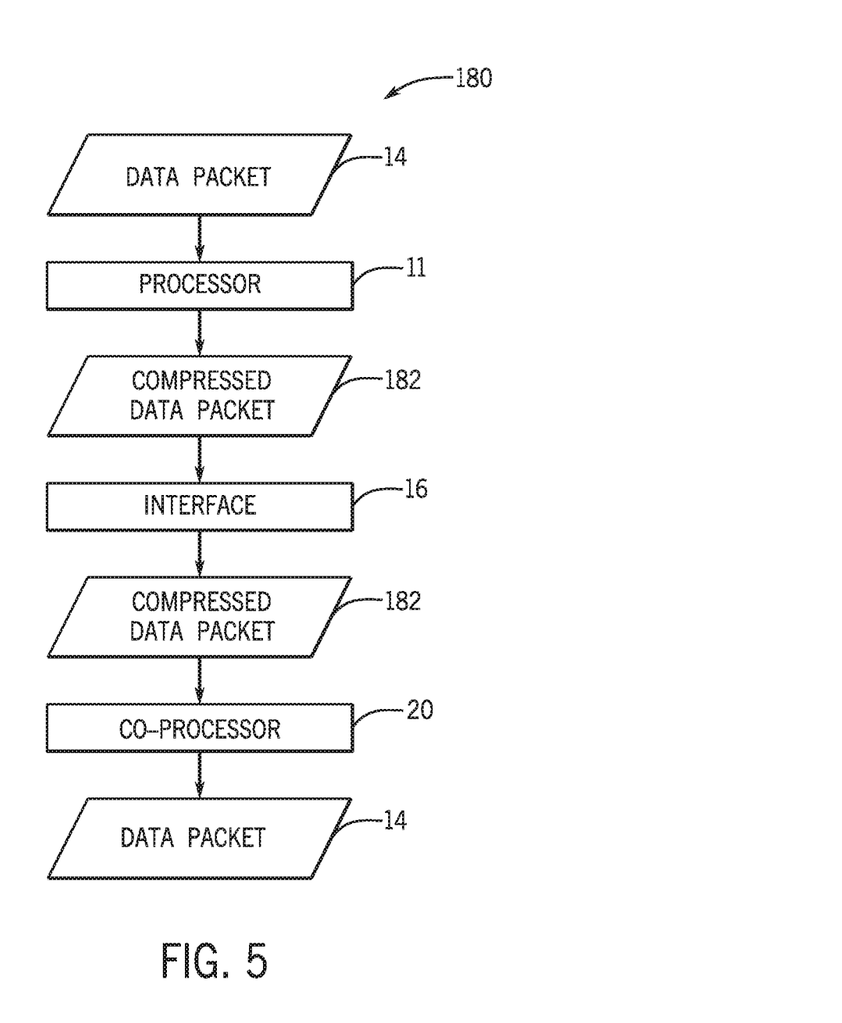
FIG. 5 is a data flow diagram illustrating data flows within the system of FIG. 1, in accordance with aspects of the present disclosure.

FIG. 5 is a data flow diagram 180 illustrating data flows within the system 10, in accordance with aspects of the present disclosure. Specifically, in certain embodiments, the data flow diagram 100 includes a data packet 14 generated by and/or provided to the SW 12. In certain embodiments, the SW 12 may compress the header 58 and/or the data payload 62 of the data packet 14, via one or more data compression techniques, as further described below. Further, the SW 12 may transmit the compressed data packet 182 (with the compressed header and/or compressed data payload) to the co-processor 20 via the shared interface 16. In particular, each of the one or more SWs 12 may compress the header 58 and/or the data payload 62 of each data packet 14 prior to transmitting the data packet 14 across the shared interface 16, thereby improving the efficiency of data transfer over the shared interface 16. In certain embodiments, the co-processor 20 may unpack the compressed data packet 182 to restore the original data packet 14.

In certain embodiments, the SW 12 may compress the header 58 and/or the data payload 62 utilizing one or more different real time compression algorithms. For example, the compression algorithm may reduce the size of the data payload 62 (e.g., reduce the length 64 of the data payload 62) without harming the data content. As a further example, the compression algorithm may reduce the size of the data payload 62 (e.g., reduce the length 64 of the data payload 62) and the header 58 (e.g., reduce the length 60 of the header 58) without harming the data content.

In certain embodiments, compression level of the header 58 and/or the data payload 62 may be dependent on the type of compression algorithm and the type of data structure (e.g., video, audio, text, jpeg, etc.). In certain compression algorithms may be utilized to compress the data payload 62 to a fraction (e.g., 90%, 80%, 70%, 60%, 50%, 40%, 30%, etc.) of the original size. For example, certain compression algorithms may be utilized to compress the data payload 62 of HTML (e.g., text) data to approximately 50% of the original size. In certain embodiments, types of compression algorithms that may be utilized to compress the header 58 and/or the data payload 62 may include LZ4 compression techniques, or any other type of compression techniques that may be utilized to compress data packets. Specifically, compressing the header 58 and/or the data payload 62 may reduce the length 60 of the header 58 and/or the length 64 of the data payload 62, thereby reducing the bandwidth needed to transmit the data packet 14 across the shared interface 16.

Figure 6:
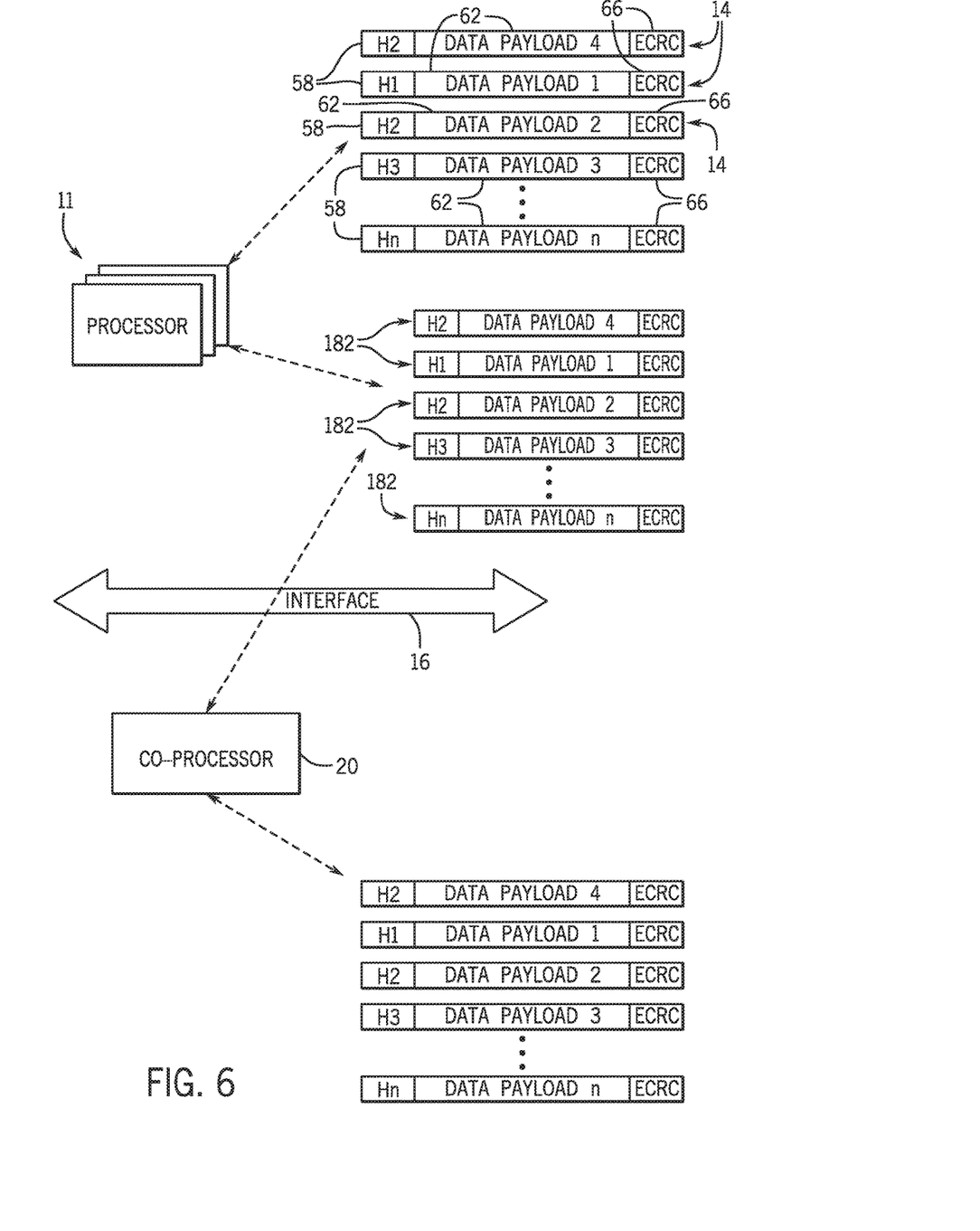
FIG. 6 is a block diagram of an embodiment of the data flows of FIG. 5, in accordance with an embodiment.

FIG. 6 is a block diagram of an embodiment of the data flow between the SW 12 and the co-processor 20 across the shared interface 16. In the illustrated embodiment, the transaction layer packets 80 are illustrated for each data packet 14. As noted above, the transaction layer packets 80 for each data packet 14 may include the header 58, the data payload 62, and the ECRC 66. In particular, the SW 12 may compress the header 58 and/or the data payload 62 with a compression algorithm. As noted above, in certain embodiments, the compression algorithm may be a real-time lossless compression algorithm that compresses the header 58 and/or the data payload 62.

Furthermore, in certain embodiments, the SW 12 may transmit the compressed data packet 182 to the co-processor 20 via the shared interface 16. It should be noted that each of the one or more SWs 12 may compress the header 58 and/or the data payload 62 of the data packet 14 to generate the compressed data packet 182, thereby reducing the bandwidth needed to transmit the accumulated data from the multiple SWs 12 across the shared interface 16.

In certain embodiments, the co-processor 20 may unpack the compressed data packet 182 received from the shared interface 16. Specifically, the co-processor 20 may utilize the same compression algorithm to unpack the compressed data packet 182 and restore the original data packet 14. Accordingly, in this manner, the system 10 may improve the efficiency of data transfer over the shared interface 16 without affecting the quality or type of data transmitted.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A method, comprising:
compressing, via a first user logic directly connected to a shared interface and directly connected to a processor that comprises a plurality of virtual machines, a header portion of a first data packet comprising the header portion and a data payload portion to generate a second data packet comprising a compressed header portion and an uncompressed data payload portion, wherein the first data packet is provided by a first virtual machine of the plurality of virtual machines;
transmitting, from the first user logic to a second user logic directly connected to a co-processor and directly connected to the shared interface, the second data packet comprising the compressed header portion via the shared interface to the co-processor, and wherein each virtual machine is configured to access the shared interface, whereby the second data packet comprising the compressed header portion reduces a bandwidth usage of the shared interface used to transmit the first data packet; and
unpacking, via the second user logic coupled to the co-processor, the compressed header portion of the second data packet to restore the first data packet.

2. The method of claim 1, wherein compressing the header portion of the first data packet comprises utilizing a translation table of the first user logic to correlate the header portion to the compressed header portion.

3. The method of claim 1, wherein compressing the header portion of the first data packet comprises utilizing a compression algorithm in the first user logic to compress a size of the data payload portion.

4. The method of claim 1, wherein the co-processor comprises a hardware accelerator.

5. The method of claim 1, wherein the shared interface is a Peripheral Component Interconnect Express (PCIe) interface.

6. The method of claim 1, wherein the shared interface is a Peripheral Component Interconnect interface (PCI), an advanced microcontroller bus architecture (AMBA), or a shared system bus.

7. A method, comprising:
compressing, via a first user logic directly connected to a shared interface and directly connected to a processor that comprises a plurality of virtual machines, a header portion of a first data packet that comprises the header portion and a data payload portion to generate a second data packet comprising a compressed header portion and an uncompressed data payload portion, wherein the first data packet is generated by a first virtual machine of the plurality of virtual machines;

transmitting the second data packet comprising the compressed header portion and the uncompressed data payload portion from the first user logic coupled to the processor to a second user logic directly connected to a co-processor and directly connected to the shared interface, whereby the second data packet comprising the compressed header portion reduces a bandwidth of the shared interface needed to transmit the first data packet; and unpacking, via the second user logic coupled to the co-processor, the compressed header portion of the second data packet to restore the first data packet.

8. The method of claim 7, wherein compressing the header portion comprises replacing a header type with a compressed header type based on a translation table of the first user logic that associates each respective header type of a plurality of header types to a respective compressed header type of a plurality of compressed header types.

9. The method of claim 7, wherein the processor runs a plurality of software and the co-processor comprises a hardware accelerator.

10. The method of claim 7, wherein the shared interface is a Peripheral Component Interconnect interface (PCI), an advanced microcontroller bus architecture (AMBA), or a shared system bus.

11. A tangible, non-transitory, machine-readable-medium, comprising machine-readable instructions to:

compress, in a first user logic directly connected to a processor and to a shared interface, a header portion of a first data packet generated in a first virtual machine of a plurality of virtual machines run on the processor to produce a compressed header portion, wherein the first data packet comprises the header portion and a payload portion;

generate, in the first user logic a second data packet comprising the compressed header portion and an uncompressed payload portion, whereby the second data packet comprising the compressed header portion reduces a bandwidth usage of the shared interface used by the first data packet;

transmit the second data packet from the first user logic to a second user logic directly connected to a co-processor and to the shared interface; and unpacking, via the second user logic coupled to the co-processor, the compressed header portion of the second data packet to restore the first data packet.

12. The machine-readable-medium of claim 11, wherein compressing the header portion to produce the compressed header portion comprises replacing the header portion of the first data packet to generate the second data packet with the compressed header portion based on a translation table.

13. The machine-readable-medium of claim 11, wherein the shared interface is a Peripheral Component Interconnect Express (PCIe) interface.

* * * * *